(12) United States Patent
Lahner et al.

(10) Patent No.: US 7,415,687 B2
(45) Date of Patent: Aug. 19, 2008

(54) METHOD AND COMPUTER PROGRAM FOR INCREMENTAL PLACEMENT AND ROUTING WITH NESTED SHELLS

(75) Inventors: Juergen K. Lahner, Morgan Hill, CA (US); Balamurugan Balasubramanian, Santa Clara, CA (US); Randall P. Fry, Greenville, NC (US)

(73) Assignee: LSI Corporation, Milpitas, CA (US)

( * ) Notice: Subject to any disclaimer, the term of this patent is extended or adjusted under 35 U.S.C. 154(b) by 406 days.

(21) Appl. No.: 11/244,530

(22) Filed: Oct. 5, 2005

(65) Prior Publication Data
US 2007/0079273 A1 Apr. 5, 2007

(51) Int. Cl.
*G06F 17/50* (2006.01)
(52) U.S. Cl. .................. 716/10; 716/11; 716/12
(58) Field of Classification Search ........... 716/1, 716/6–14
See application file for complete search history.

(56) References Cited

U.S. PATENT DOCUMENTS

| | | | |
|---|---|---|---|
| 2004/0117744 A1* | 6/2004 | Nation et al. | 716/1 |
| 2004/0230933 A1* | 11/2004 | Weaver et al. | 716/12 |
| 2005/0010889 A1* | 1/2005 | Barnes | 716/11 |

* cited by examiner

*Primary Examiner*—Paul Dinh
(74) *Attorney, Agent, or Firm*—Eric James Whitesell

(57) ABSTRACT

A method of placing and routing an integrated circuit design includes generating an initial placement and routing for at least a portion of an integrated circuit design. The initial placement and routing of the integrated circuit design is analyzed to find a critical location and is partitioned into a series of nested shells. Each shell surrounds the critical location and each preceding shell. An ordering of the shells and at least one of a timing constraint and an area constraint are selected for each shell. Each shell is placed and routed in the order selected according to the timing constraint and area constraint.

18 Claims, 7 Drawing Sheets

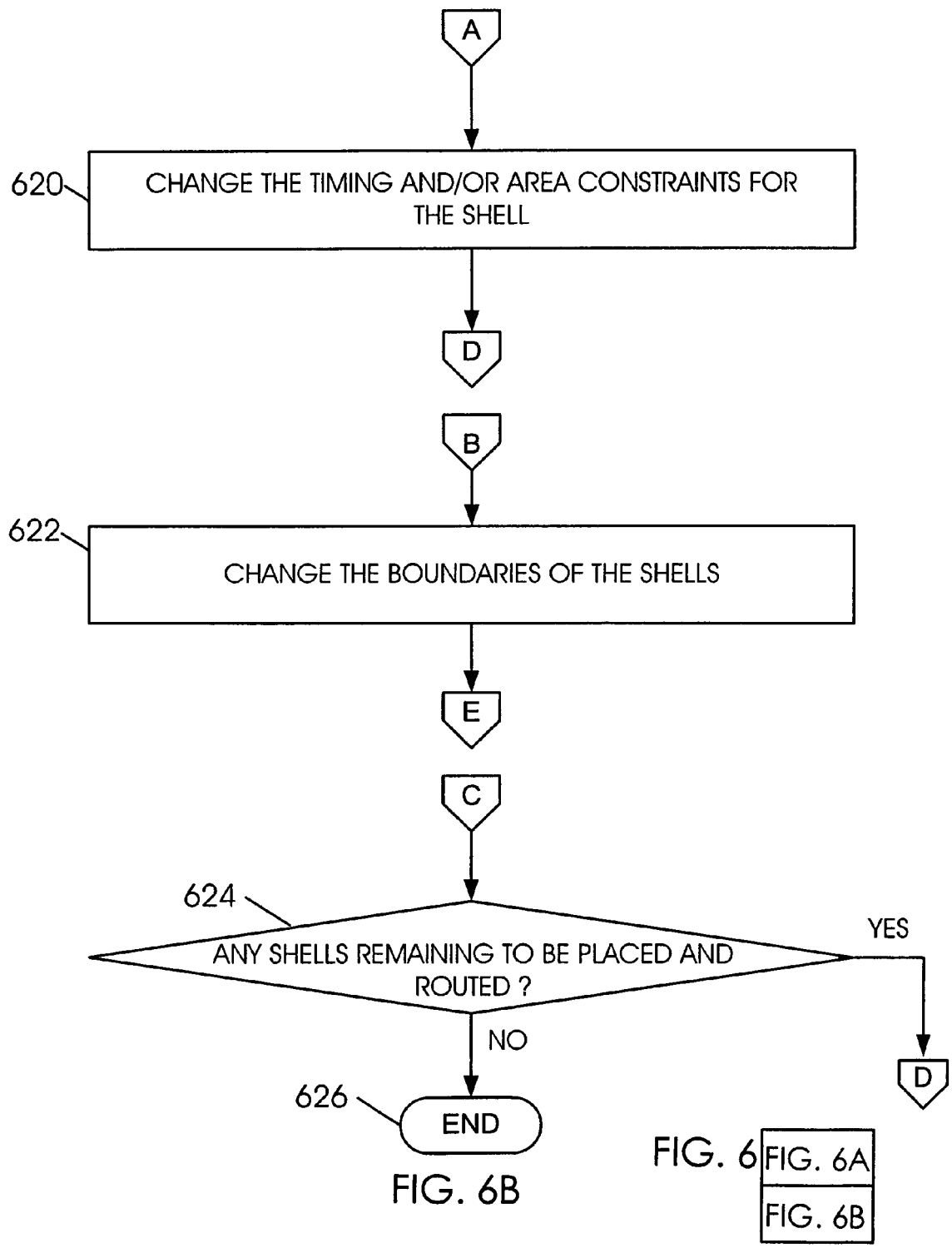

METHOD AND COMPUTER PROGRAM FOR INCREMENTAL PLACEMENT AND ROUTING WITH NESTED SHELLS

BACKGROUND OF THE INVENTION

1. Field of the Invention

The present invention is directed to the design and manufacture of integrated circuits. More specifically, but without limitation thereto, the present invention is directed to methods of placement and routing for an integrated circuit design.

2. Description of Related Art

An important phase in the design of an integrated circuit is to verify that each logic path in the integrated circuit design meets all timing constraints required to meet performance specifications. The verification of the timing for each logic path in an integrated circuit design is typically called timing closure. For example, if the propagation delay is too long in a path that propagates a clock signal to a flip-flop, the flip-flop may not be set to the correct value when the clock signal arrives, resulting in a timing violation. Also, signal routing congestion may occur in locations where there are more signals to route than there is available routing area on the chip. The locations in the integrated circuit design where timing violations or congested routing areas occur are referred to herein as critical areas.

Timing closure is a resource-intensive task in which all timing violations and congested signal routes in the placement and routing must be resolved before an integrated circuit design may be taped out, that is, generated in mask form for depositing and etching layers of various materials on a silicon substrate. Place and route tools typically resolve timing and signal congestion problems in critical areas by moving the problems outside of the critical areas into the surrounding logic.

SUMMARY OF THE INVENTION

A method of placing and routing an integrated circuit design includes steps of (a) generating an initial placement and routing for at least a portion of an integrated circuit design; (b) analyzing the initial placement and routing of the integrated circuit design to find a critical location; (c) partitioning the initial placement and routing of the integrated circuit design into a series of nested shells wherein each shell surrounds the critical location and each preceding shell; (d) selecting an ordering of the shells; (e) selecting at least one of a timing constraint and an area constraint for each shell; and (f) placing and routing each shell in the order selected in step (d) according to the at least one timing constraint and area constraint selected in step (e).

In another embodiment, a computer program product includes:

a medium for embodying a computer program for input to a computer; and a computer program embodied in the medium for causing the computer to perform steps of:

(a) generating an initial placement and routing for at least a portion of an integrated circuit design;

(b) analyzing the initial placement and routing of the integrated circuit design to find a critical location;

(c) partitioning the initial placement and routing of the integrated circuit design into a series of nested shells wherein each shell surrounds the critical location and each preceding shell;

(d) selecting an ordering of the shells;

(e) selecting at least one of a timing constraint and an area constraint for each shell; and (f) placing and routing each shell in the order selected in step (d) according to the at least one timing constraint and area constraint selected in step (e).

BRIEF DESCRIPTION OF THE DRAWINGS

The above and other aspects, features and advantages will become more apparent from the description in conjunction with the following drawings presented by way of example and not limitation, wherein like references indicate similar elements throughout the several views of the drawings, and wherein.

Elements in the figures are illustrated for simplicity and clarity and have not necessarily been drawn to scale. For example, the dimensions, sizing, and/or relative placement of some of the elements in the figures may be exaggerated relative to other elements to clarify distinctive features of the illustrated embodiments. Also, common but well-understood elements that may be useful or necessary in a commercially feasible embodiment are often not depicted in order to facilitate a less obstructed view of the illustrated embodiments.

DESCRIPTION OF THE ILLUSTRATED EMBODIMENTS

The following description is not to be taken in a limiting sense, rather for the purpose of describing by specific examples the general principles that are incorporated into the illustrated embodiments. For example, certain actions or steps may be described or depicted in a specific order to be performed. However, practitioners of the art will understand that the specific order is only given by way of example and that the specific order does not exclude performing the described steps in another order to achieve substantially the same result. Also, the terms and expressions used in the description have the ordinary meanings accorded to such terms and expressions in the corresponding respective areas of inquiry and study except where other meanings have been specifically set forth herein.

Figure 1:
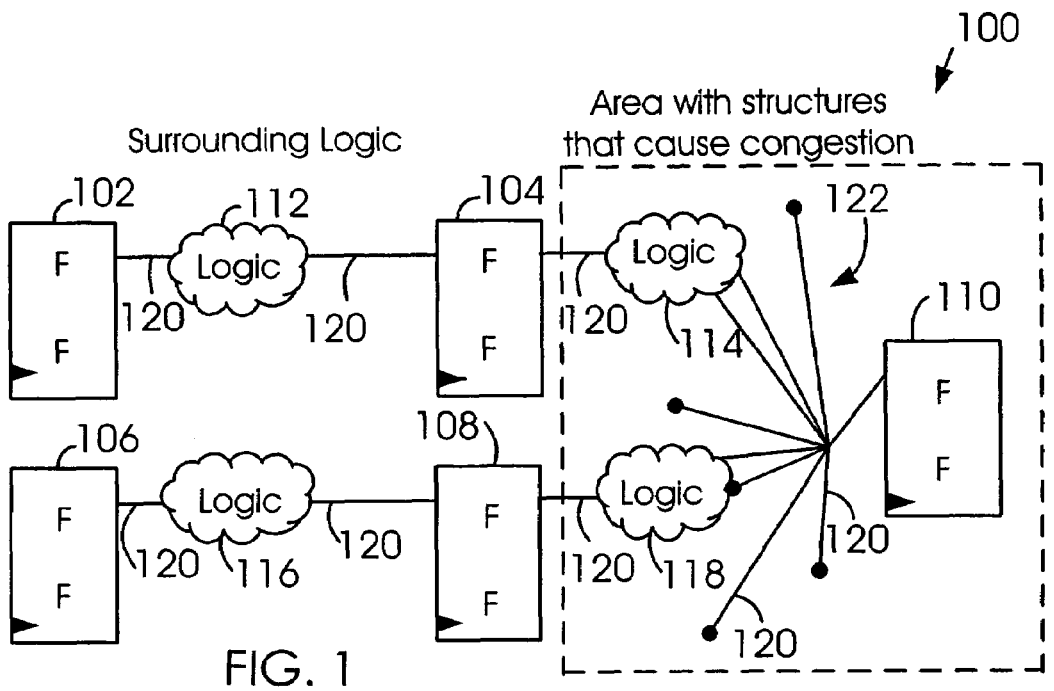
FIG. 1 illustrates a typical placement and routing diagram for an integrated circuit design of the prior art.

FIG. 1 illustrates a typical placement and routing diagram 100 for an integrated circuit design of the prior art. Shown in FIG. 1 are flip-flops 102, 104, 106, 108, and 110, logic clouds 112, 114, 116, and 118, interconnects 120, and a fan-in cone 122.

In FIG. 1, the flip-flops 102, 104, 106, 108, and 110 are placed around the logic clouds 112, 114, 116, and 118 and are connected to one another by routing the interconnects 120 between them. Each of the logic clouds 112, 114, 116, and 118 represent a series of logic elements such as inverters, NAND gates, multiplexers, and so on that are connected together to perform a logical function on one or more input signals. The fan-in cone 122 results when a number of interconnects 120 merge at a common point. In the example of FIG. 1, the common point of the fan-in cone 122 is the input of the flip-flop 110.

The placement and routing for the integrated circuit design is generally analyzed to find critical areas, that is, the locations of timing violations and congested signal routes. For example, the interconnect 120 between the flip-flop 104 and the logic cloud 114 may have a length that results in a timing violation at the flip-flop 110. Also, the fan-in cone 122 may have more interconnects 120 than there is available routing area around the flip-flop 110, resulting in congested signal routes. To achieve timing closure, a typical placement and routing method moves the flip-flop 104 closer to the logic cloud 114 to correct the timing violation and moves the flip-flop 108 and the logic cloud 118 away from the fan-in cone 122 to increase the signal routing area as shown in FIG. 2.

Figure 2:
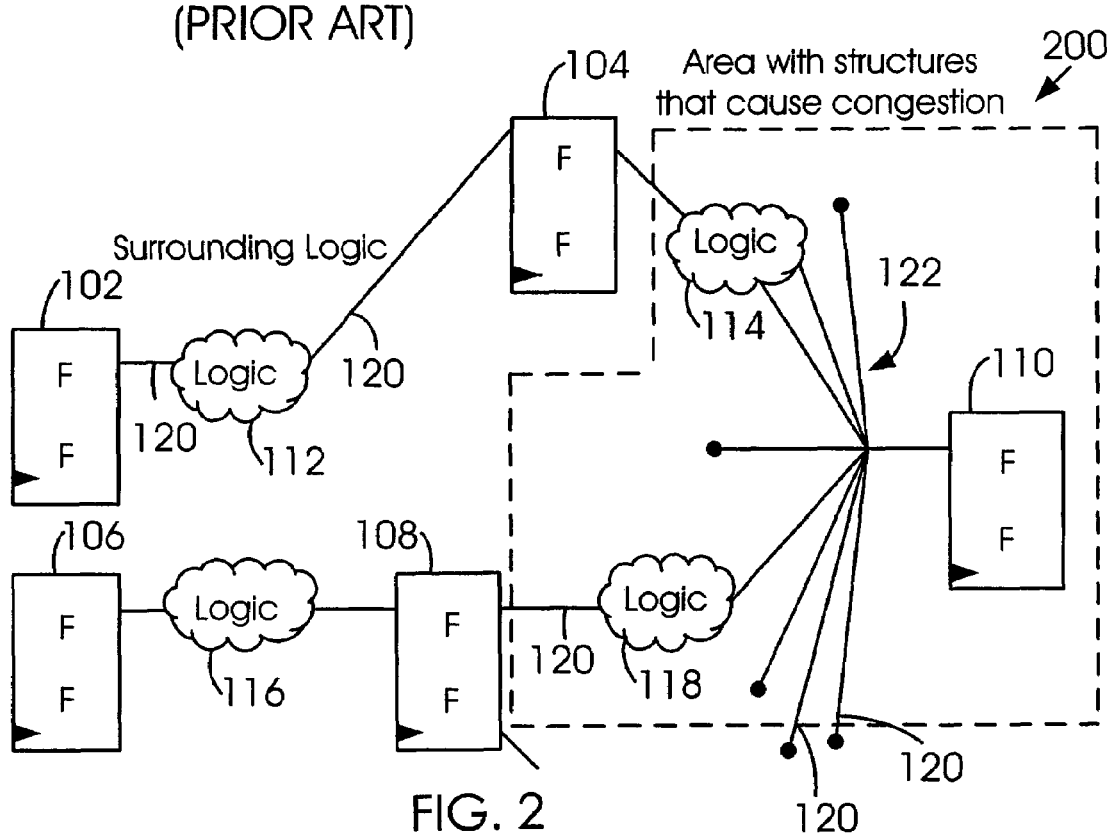
FIG. 2 illustrates a placement and routing diagram after moving the critical areas of FIG. 1 into the surrounding logic.

FIG. 2 illustrates a placement and routing diagram 200 after moving the critical areas of FIG. 1 into the surrounding logic. Shown in FIG. 2 are flip-flops 102, 104, 106, 108, and 110, logic clouds 112, 114, 116, and 118, interconnects 120, and a fan-in cone 122.

In FIG. 2, the interconnect 120 between the flip-flop 104 and the logic cloud 114 has been shortened to avoid the timing violation, and the logic cloud 118 has been moved away from the flip-flop 110 to avoid the congested signal routing area. However, shortening the interconnect 120 between the flip-flop 104 and the logic cloud 114 also lengthens the interconnect 120 between the logic cloud 112 and the flip-flop 104. Also, moving the logic cloud 118 away from the flip-flop 110 reduces the available routing area in the surrounding logic. A disadvantage of resolving timing and signal congestion problems in critical areas by moving the problems from the critical areas into the surrounding logic is that new timing violations and congested signal routing areas may be created in the surrounding logic that may be more difficult to correct than before. In some cases, it may not be possible to correct the new problems without redesigning the entire integrated circuit chip. Accordingly, it is desirable to correct timing violations and congested signal routing areas in a way that does not propagate the problems in the critical areas into the surrounding logic.

In one embodiment, a method of placing and routing an integrated circuit design includes steps of (a) receiving a netlist for an integrated circuit design; (b) generating an initial placement and routing of the integrated circuit design from the netlist; (c) analyzing the initial placement and routing of the integrated circuit design to find a critical location; (d) partitioning the initial placement and routing into a series of nested shells wherein each shell surrounds the critical location and each preceding shell; (e) selecting an ordering of the shells; (f) selecting at least one of a timing constraint and an area constraint for each shell; and (g) placing and routing each shell in the order selected in step (e) according to the at least one timing constraint and area constraint selected in step (f).

Figure 3:
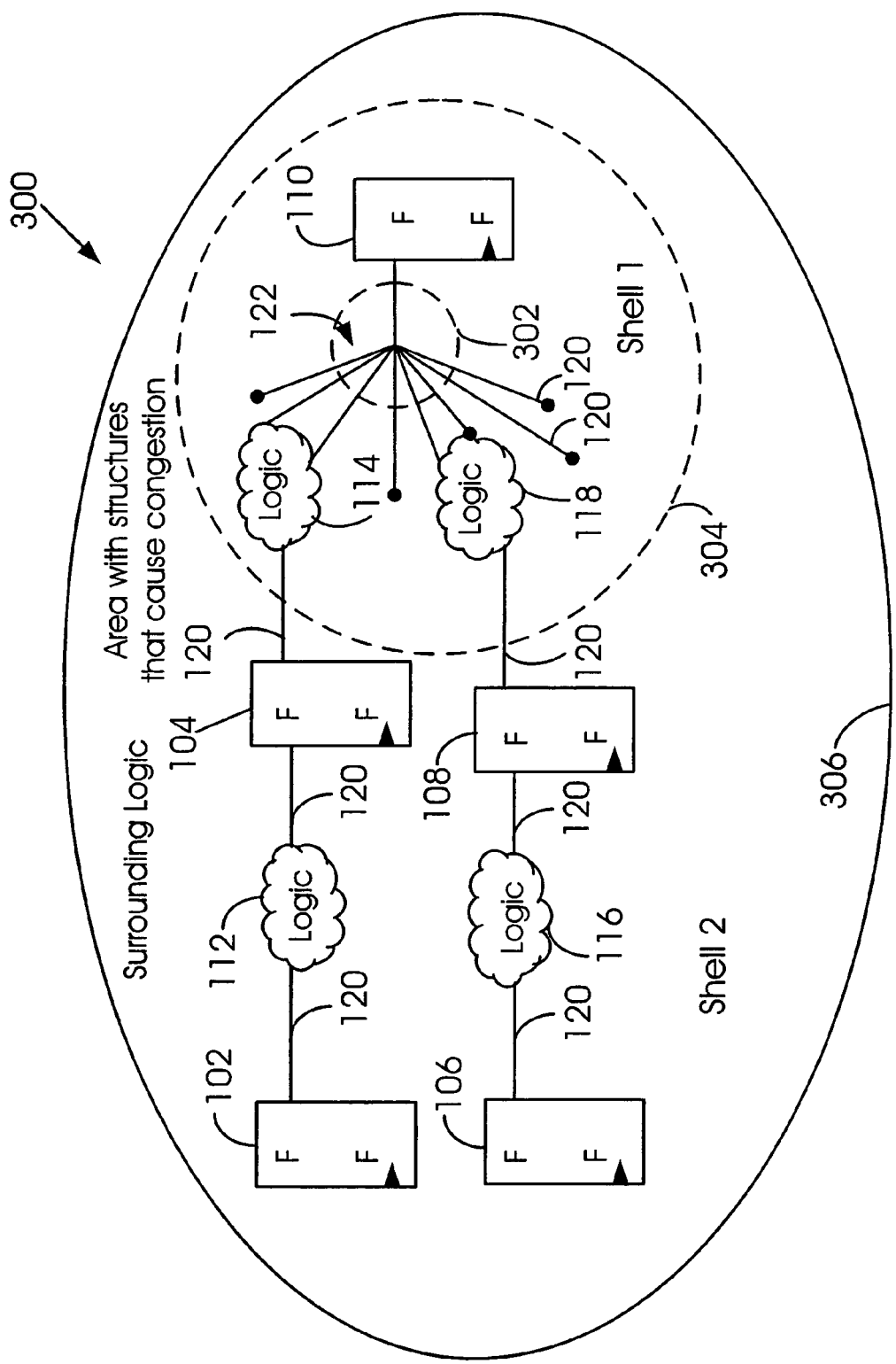
FIG. 3 illustrates a placement and routing diagram after partitioning the initial placement and routing of FIG. 1 into nested shells.

FIG. 3 illustrates a placement and routing diagram 300 after partitioning the integrated circuit design of FIG. 1 into nested shells. Shown in FIG. 2 are flip-flops 102, 104, 106, 108, and 110, logic clouds 112, 114, 116, and 118, interconnects 120, a fan-in cone 122, a critical area 302, and nested shells 304 and 306.

In FIG. 3, the initial placement and routing of FIG. 1 is partitioned into the nested shells 304 and 306. The first shell 304 surrounds the critical area 302, which includes the fan-in cone 122. The second shell 306 surrounds the preceding shell 304 and includes a portion of the logic elements in the integrated circuit design that lie outside the preceding shell 304. In this example, the portion of the logic elements in the integrated circuit design that lie outside the preceding shell 304 includes the flip-flops 102, 104, 106, and 108 and the logic clouds 112 and 116. Only two nested shells are used in the example of FIG. 3; however, any number of shells may be nested in the same manner to practice various embodiments within the scope of the appended claims.

Figure 4:
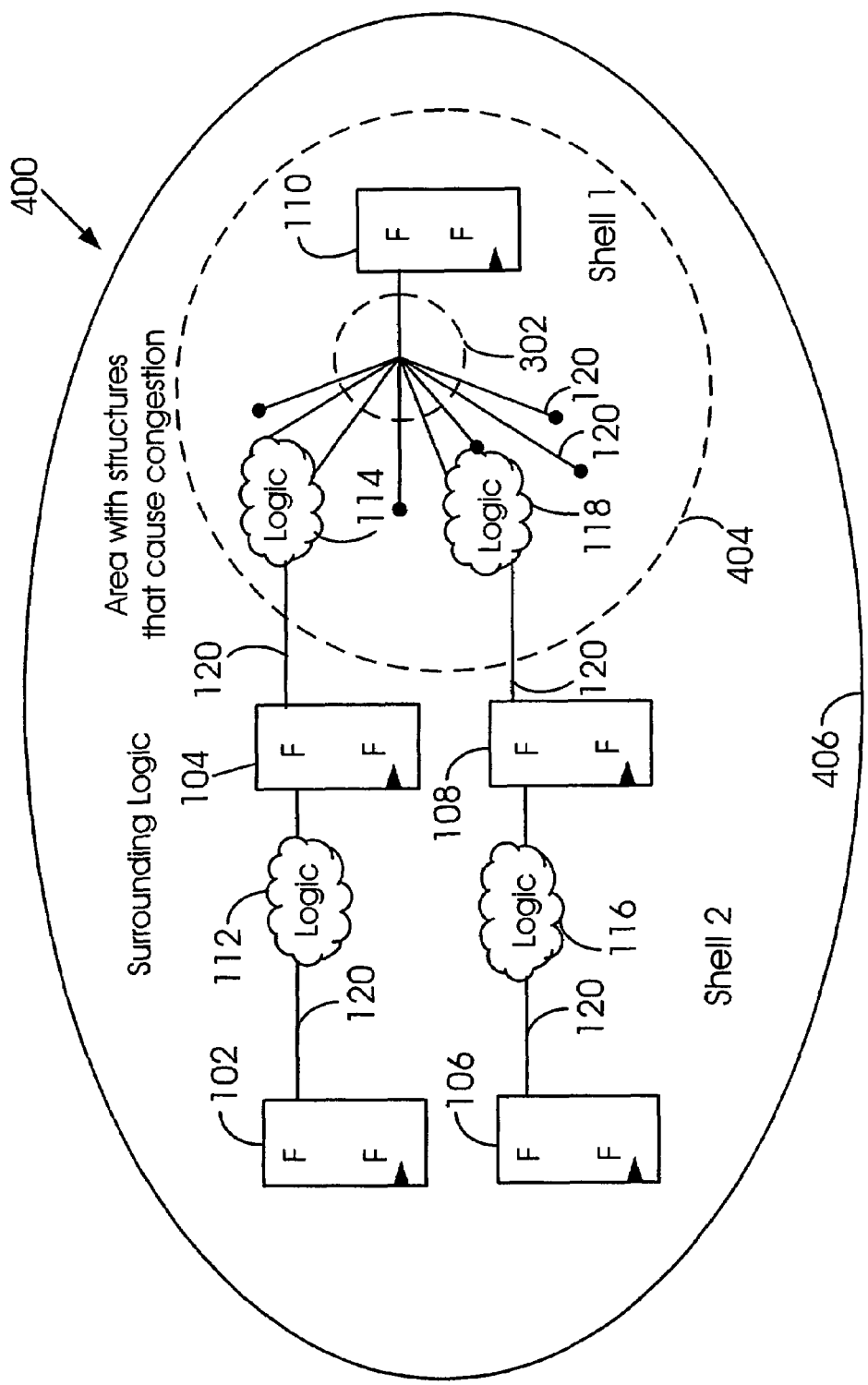
FIG. 4 illustrates the nested shells of FIG. 3 after placing and routing each shell in order from outermost to innermost.

FIG. 4 illustrates the nested shells of FIG. 3 after placing and routing each shell in an order from outermost to innermost. Shown in FIG. 4 are flip-flops 102, 104, 106, 108, and 110, logic clouds 112, 114, 116, and 118, interconnects 120, a fan-in cone 122, a critical area 302, and nested shells 404 and 406.

In FIG. 4, the logic elements inside the outermost shell 406 are placed and routed using the initial placement and routing coordinates of FIG. 1 as a starting point. Alternatively, a new placement and routing may be performed for the logic elements inside the outer shell 406 without using the initial placement and routing coordinates of FIG. 1. The placement and routing of the logic elements in the shell 406 may be performed in the same manner as for the entire integrated circuit design, except that the placement and routing of the logic elements in the shell 406 is an incremental, or partial, placement and routing of only the portion of the integrated circuit design that is included within the shell 406. In other words, the placement and routing is performed for only the logic elements that lie inside the shell 406 and outside the preceding shell 404. Accordingly, the area of the shell 406 is optimized for the portion of the logic elements in the integrated circuit design that lie inside the shell 406 and outside the shell 404.

As a result of the optimization realized by the incremental placement and routing of the shell 406, the area of the shell 406 is reduced compared to that of the shell 306 in FIG. 3, and the area of the innermost shell 404 is increased compared to that of the shell 304.

After placing and routing the outermost shell 406, the next outermost shell is placed and routed in the same manner. In this example, the next outermost shell is the innermost shell 404 surrounding the critical area 302. The additional area provided by performing the placement and routing of the outermost shell 406 before the placement and routing of the innermost shell 404 resolves the problems created by the initial placement and routing of FIG. 1 without propagating the problems to the surrounding logic.

Figure 5:
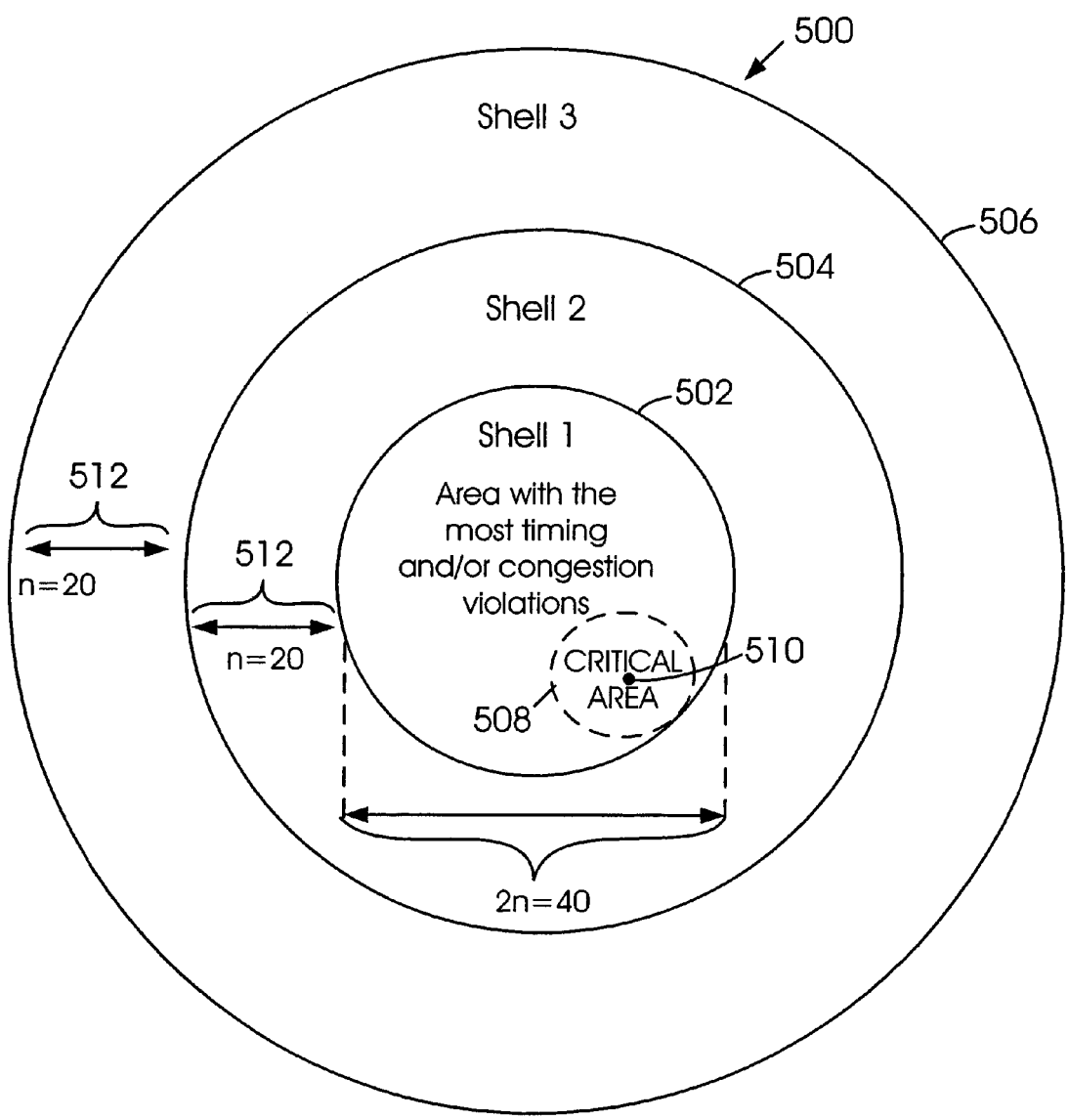
FIG. 5 illustrates how boundaries of nested shells may be defined for an incremental placement and routing of the initial placement and routing of FIG. 1.

FIG. 5 illustrates a diagram 500 of how boundaries of nested shells may be defined for an incremental placement and routing of the initial placement and routing of FIG. 1. Shown in FIG. 5 are nested shells 502, 504, and 506, a critical area 508, a critical location 510, logic levels 512, and flip-flop levels 514.

In FIG. 5, the critical location 510 is, for example, the location of the flip-flop at which the worst timing violation occurs or the center of the most congested routing area in the initial placement and routing of an integrated circuit design. The critical area 508 includes the critical location 510 and extends from the critical location by a distance determined, for example, by a user selected distance. Alternatively, the critical area 508 may be determined by a distance along each path from the critical location 510 that includes a selected number n of logic levels 512, that is, all logic elements are counted toward the selected number n including inverters, NAND gates, and flip-flops. In another embodiment, the critical area 508 may be determined by a distance along each path from the critical location 510 that includes a selected number n of flip-flop levels regardless of the number of intervening logic elements, that is, only flip-flops are counted toward the selected number n.

The area of the innermost shell 502 may be identical to the critical area 508, or the innermost shell 502 may be larger or smaller than the critical area 508, depending on the integrated circuit design. Each of the subsequent shells 504 and 506 may have a boundary that is relatively distant from the preceding shell boundary by the same distance, number of logic levels, or number of flip-flop levels as the boundary of the innermost shell 502 is from the critical location 510.

The nested shells 502, 504, and 506 are depicted as circles in FIG. 5 to illustrate the concept that each shell surrounds a preceding shell. In general, each of the nested shells 502, 504, and 506 is representative of a subset of the placement and routing diagram and is not necessarily circular in shape.

Alternatively, other criteria may be used to determine the boundaries of the outer shells 504 and 506 according to well-known techniques to practice various embodiments within the scope of the appended claims.

Figure 6A:
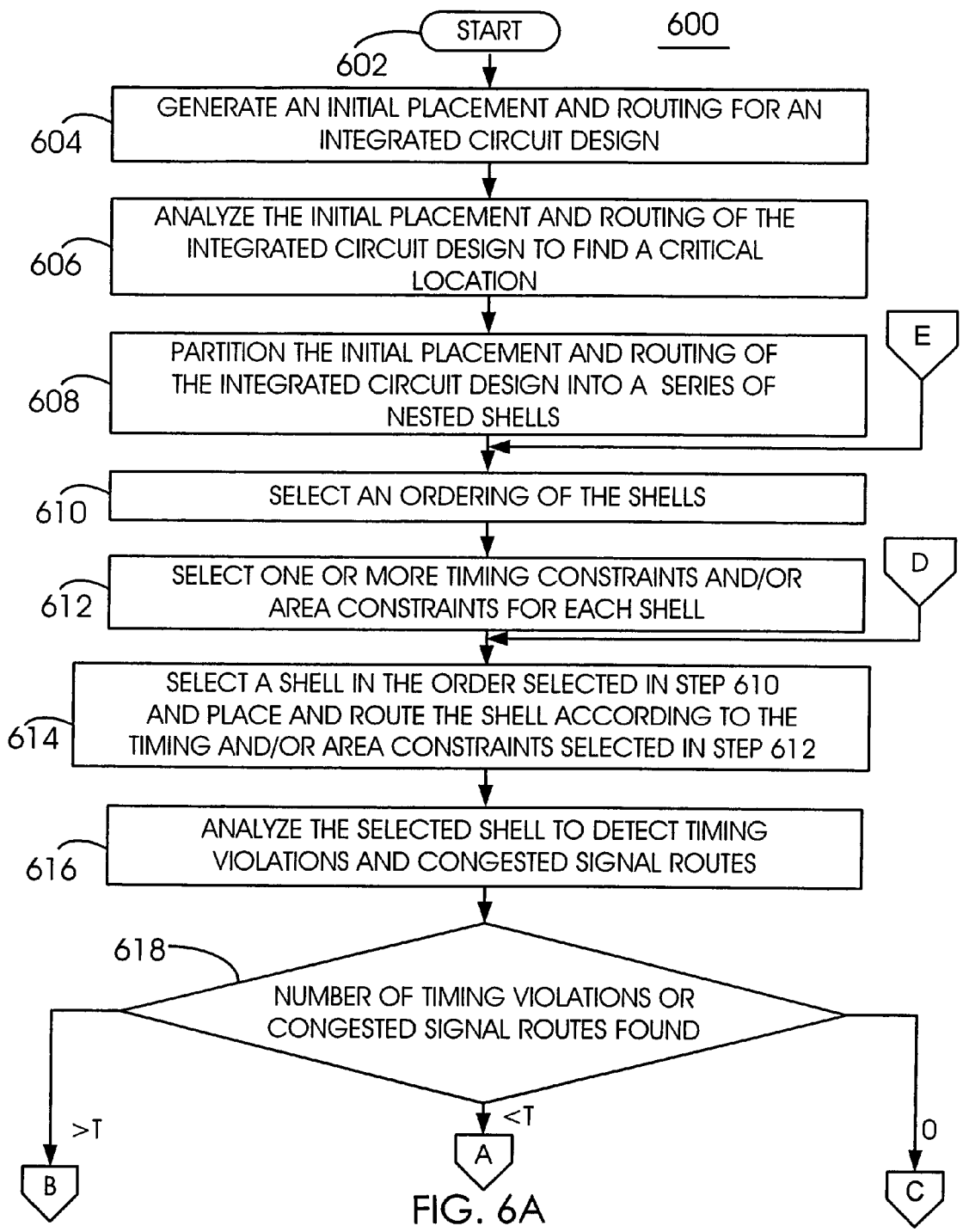
FIG. 6 illustrates a flow chart of a method of incremental placement and routing of an integrated circuit design using the nested shells of FIG. 5.

FIG. 6 illustrates a flow chart 600 of a method of incremental placement and routing of an integrated circuit design using the nested shells of FIG. 5.

Step 602 is the entry point of the flow chart 600.

In step 604, an initial placement and routing is generated for an integrated circuit design, for example, from a netlist according to well-known techniques.

In step 606, the initial placement and routing of the integrated circuit design is analyzed according to well-known techniques to find a critical location, for example, the worst timing violation. Timing reports generated by typical timing closure software include a start point and an end point of each timing violation. The end point is usually a receiving flip-flop. The location of the receiving flip-flop reporting the worst timing violation, that is, the highest value of negative slack, would be a critical location in this example. Alternatively, the critical location may be the center of the area having the greatest number of congested signal routes.

In step 608, the initial placement and routing of the integrated circuit design is partitioned into a series of nested shells wherein each shell surrounds the critical location and each preceding shell. The boundary of the innermost shell may be determined, for example, by a user selected distance from the critical location, by a distance along each path from the critical location that includes a selected number of logic levels or by a distance along each path from the critical location that includes a selected number of flip-flop levels. Accordingly, a shell may include partial nets if a selected number of logic levels is used to establish the shell boundary, or a shell may include only entire nets if a selected number of flip-flops is used to establish the shell boundary.

Each of the outer shells may have a boundary determined by the same user selected distance from the boundary of the preceding shell, or by the same number of logic levels, or by the same number of flip-flops from the boundary of the preceding shell. The boundary of a shell may also terminate at an input or output of the integrated circuit design before reaching the selected number of logic levels or flip-flops. Alternatively, each shell may have a boundary that is determined by any selected distance, number of logic levels, or number of flip-flops from the boundary of the preceding shell to practice various embodiments within the scope of the appended claims.

The entire integrated circuit design may be partitioned into shells as described above, or only a portion of the integrated circuit design may be partitioned into shells if desired to practice various embodiments within the scope of the appended claims. For example, a user may select only the first 100 flip-flop levels of the integrated circuit design for partitioning into a series of 10 nested shells surrounding a critical location to resolve timing violations and/or congested signal routes.

In step 610, an ordering of the shells is selected. For example, the ordering may be from outermost to innermost so that the outermost shell is placed and routed first, and the innermost shell is placed and routed last. As explained above, this ordering passes the area and timing savings inward to the critical location where they are most needed. Alternatively, any other ordering may be selected to practice various embodiments within the scope of the appended claims. For example, a shell that includes the fewest timing violations and/or congested signal routes may be placed and routed first, and so on, until the shell having the most timing violations and/or congested signal routes is placed and routed last. Also, some shells may be omitted from the ordering. For example, a user may omit shells from the ordering that are reserved for logic that has not yet been placed.

In step 612, one or more timing constraints and/or area constraints are selected for each shell. For example, a timing constraint may be a minimum slack margin, and an area constraint may be a maximum signal routing density.

In step 614, a shell is selected in the order selected in step 610 and placed and routed according to the timing and/or area constraints selected in step 612.

In step 616, the selected shell is analyzed to detect timing violations and congested signal routes.

In step 618, if no timing violations or congested signal routes are found, then the selected shell is error-free, and the method continues from step 624. If a number of timing violations or congested signal routes is found that does not exceed a selected error threshold T, for example 10, then the method continues from step 620. If a number of timing violations or congested signal routes exceeds the selected error threshold, then the method continues from step 622.

Alternatively, the selected error threshold may be expressed as a percentage of a clock cycle. For example, a timing violation that is less than 10 percent of a clock cycle may probably be corrected by adjusting the timing and/or area constraints of the shell, while a timing violation that exceeds 10 percent of a clock cycle may require changing the definition of the shell boundary.

In step 620, the timing and/or area constraints for the shell are changed, and the method continues from step 614. For example, the area of the selected shell may be decreased, or the timing slack margin may be increased to ensure that timing closure may be achieved in succeeding shells.

In step 622, the boundaries of the shells are changed, that is, a new partition of nested shells is defined. For example, a new partition of nested shells may be defined by decreasing the number of logic levels or flip-flop levels in each shell. The method then continues from step 610.

In step 624, if any shells remain to be placed and routed, the method continues from step 614. Otherwise, the method continues from step 626.

Step 626 is the exit point of the flow chart 600.

The number of shells and the area of each shell may be adjusted to the complexity of the integrated circuit design so that the number of logic elements and interconnects for each shell may be readily accommodated by the placement and routing software. The area of each shell may be subsequently increased or decreased by the placement and routing software as needed to expedite the resolution of timing violations and congested signal routes.

In another embodiment, a computer program product includes:

a medium for embodying a computer program for input to a computer; and a computer program embodied in the medium for causing the computer to perform steps of:

(a) generating an initial placement and routing for an integrated circuit design;

(b) analyzing the initial placement and routing of the integrated circuit design to find a critical location;

(c) partitioning the initial placement and routing of the integrated circuit design into a series of nested shells wherein each shell surrounds the critical location and each preceding shell;

(d) selecting an ordering of the shells;

(e) selecting at least one of a timing constraint and an area constraint for each shell; and (f) placing and routing each shell in the order selected in step (d) according to the at least one timing constraint and area constraint selected in step (e).

Figure 7:
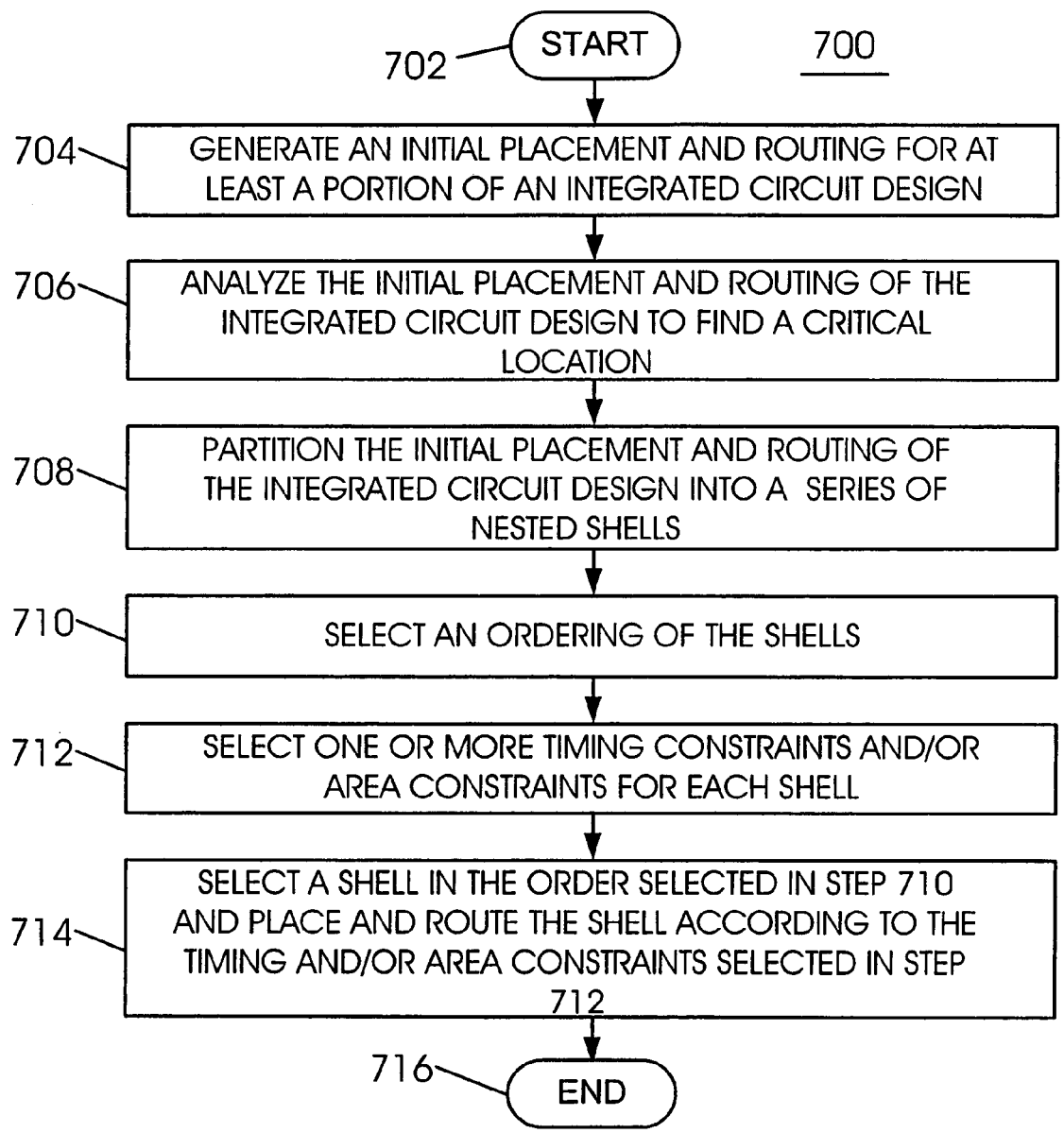
FIG. 7 illustrates a flow chart of a computer program product summarizing the method of FIG. 6

FIG. 7 illustrates a flow chart 700 of a computer program product summarizing the method of FIG. 6.

Step 702 is the entry point of the flow chart 700.

In step 704, an initial placement and routing is generated for at least a portion of an integrated circuit design. For example, if a netlist is available for only some part of an integrated circuit design, then the initial placement and routing may be generated for the partial integrated design.

In step 706, the initial placement and routing of the integrated circuit design is analyzed to find a critical location.

In step 708, the initial placement and routing of the integrated circuit design is partitioned into a series of nested shells wherein each shell surrounds the critical location and each preceding shell.

In step 710, an ordering of the shells is selected.

In step 712, a timing constraint and/or an area constraint is selected for each shell.

In step 714, each shell is placed and routed in the order selected in step 710 according to timing constraint and/or area constraint selected in step 712.

Step 716 is the exit point of the flow chart 700.

Although the flowchart description above is described and shown with reference to specific steps performed in a specific order, these steps may be combined, sub-divided, or reordered without departing from the scope of the claims. Unless specifically indicated, the order and grouping of steps is not a limitation of other embodiments that may lie within the scope of the claims.

The specific embodiments and applications thereof described above are for illustrative purposes only and do not preclude modifications and variations that may be made within the scope of the following claims.

What is claimed is:

1. A method of placing and routing an integrated circuit design comprising steps of:

(a) generating an initial placement and routing for at least a portion of an integrated circuit design;

(b) analyzing the initial placement and routing of the integrated circuit design to find a critical location;

(c) partitioning the initial placement and routing of the integrated circuit design into a series of nested shells wherein each shell surrounds the critical location and each preceding shell;

(d) selecting an ordering of the shells from outermost to innermost;

(e) selecting at least one of a timing constraint and an area constraint for each shell; and (f) placing and routing each shell in the order selected in step (d) according to the at least one timing constraint and area constraint selected in step (e).

2. The method of claim 1 further comprising a step of analyzing each shell to detect remaining timing violations and congested signal routing areas.

3. The method of claim 2 further comprising a step of redefining the timing and area constraints for each shell in the succession of shells and continuing from step (f) when a number of timing violations and congested signal routing areas remains that does not exceed an error threshold.

4. The method of claim 3 further comprising a step of re-partitioning the initial placement and routing into a succession of shells wherein each shell in the succession of shells surrounds each preceding shell and continuing from step (e) when a number of timing violations and congested signal routing areas remains that exceeds the error threshold.

5. The method of claim 1 wherein step (c) comprises including a selected number of logic levels in each shell.

6. The method of claim 1 wherein step (c) comprises including a selected number of flip-flops in each shell.

7. The method of claim 1 wherein step (e) comprises increasing timing slack margin of at least one shell.

8. The method of claim 1 wherein step (e) comprises reducing an area of at least one shell.

9. The method of claim 1 wherein step (d) comprises omitting at least one shell from the ordering of the shells.

10. A computer readable storage medium tangibly embodying instructions for a computer that when executed by the computer implement a method for placing and routing an integrated circuit design, the method comprising steps of:

(a) generating an initial placement and routing for at least a portion of an integrated circuit design;

(b) analyzing the initial placement and routing of the integrated circuit design to find a critical location;

(c) partitioning the initial placement and routing of the integrated circuit design into a series of nested shells wherein each shell surrounds the critical location and each preceding shell;

(d) selecting an ordering of the shells from outermost to innermost;

(e) selecting at least one of a timing constraint and an area constraint for each shell; and (f) placing and routing each shell in the order selected in step (d) according to the at least one timing constraint and area constraint selected in step (e).

11. The computer readable storage medium of claim 10 further comprising a step of analyzing each shell to detect remaining timing violations and congested signal routing areas.

12. The computer readable storage medium of claim 11 further comprising a step of redefining the timing and area constraints for each shell in the succession of shells and continuing from step (f) when a number of timing violations and congested signal routing areas remains that does not exceed an error threshold.

13. The computer readable storage medium of claim 12 further comprising a step of re-partitioning the initial placement and routing into a succession of shells wherein each shell in the succession of shells surrounds each preceding shell and continuing from step (d) when a number of timing violations and congested signal routing areas remains that exceeds the error threshold.

14. The computer readable storage medium of claim 10 wherein step (c) comprises including a selected number of logic levels in each shell.

15. The computer readable storage medium of claim 10 wherein step (c) comprises including a selected number of flip-flops in each shell.

16. The computer readable storage medium of claim 10 wherein step (e) comprises increasing timing slack margin of at least one shell.

17. The computer readable storage medium of claim 10 wherein step (e) comprises reducing an area of at least one shell.

18. The computer readable storage medium of claim 10 wherein step (d) comprises omitting at last one shell from the ordering of the shells.

* * * * *